(12) United States Patent
Anandakumar et al.

(10) Patent No.: US 9,252,780 B2
(45) Date of Patent: *Feb. 2, 2016

(54) TCXO REPLACEMENT FOR GPS

(71) Applicant: MaxLinear, Inc., Carlsbad, CA (US)

(72) Inventors: Anand K. Anandakumar, San Diego, CA (US); Hyungjin Kim, Irvine, CA (US); Curtis Ling, Carlsbad, CA (US)

(73) Assignee: MaxLinear, Inc., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/784,761

(22) Filed: Mar. 4, 2013

(65) Prior Publication Data
US 2014/0049331 A1 Feb. 20, 2014

Related U.S. Application Data

(63) Continuation of application No. 13/025,111, filed on Feb. 10, 2011, now Pat. No. 8,373,515.

(60) Provisional application No. 61/422,329, filed on Dec. 13, 2010, provisional application No. 61/303,075, filed on Feb. 10, 2010.

(51) Int. Cl.
*H03L 1/02* (2006.01)
*G01S 19/23* (2010.01)
*H03L 7/197* (2006.01)

(52) U.S. Cl.
CPC ............. *H03L 1/026* (2013.01); *G01S 19/235* (2013.01); *H03L 1/022* (2013.01); *H03L 7/1976* (2013.01)

(58) Field of Classification Search
CPC ........................................ H03L 1/026
USPC ..................................... 331/176, 66
See application file for complete search history.

(56) References Cited

U.S. PATENT DOCUMENTS

| 6,509,870 | B1 | 1/2003 | Matsushita et al. |
| 7,375,681 | B1 | 5/2008 | Woo |
| 8,373,515 | B2* | 2/2013 | Anandakumar et al. ...... 331/176 |
| 2003/0214432 | A1 | 11/2003 | Tawadrous et al. |

(Continued)

OTHER PUBLICATIONS

International Search Report and Written Opinion for PCT Application No. PCT/US2011/024406, mailed on Apr. 6, 2011, 18 pages.

(Continued)

*Primary Examiner* — Joseph Chang
(74) *Attorney, Agent, or Firm* — Kilpatrick Townsend & Stockton LLP

(57) ABSTRACT

To determine the level of frequency drift of a crystal oscillator as a result of a change in the its temperature, the temperature of the crystal oscillator is sensed and used together with previously stored data that includes a multitude of drift values of the frequency of the crystal oscillator each associated with a temperature of the crystal oscillator. Optionally, upon initialization of a GPS receiver in which the crystal oscillator is disposed, an initial temperature of the crystal oscillator is measured and a PLL is set to an initial frequency in association with the initial temperature. When acquisition fails in a region, the ppm region is changed. The temperature of the crystal oscillator is periodically measured and compared with the initial temperature, and the acquisition process is reset if there is a significant change in temperature. The GPS processor enters the tracking phase when acquisition is successful.

11 Claims, 5 Drawing Sheets

(56) References Cited

U.S. PATENT DOCUMENTS

| | | |
|---|---|---|
| 2005/0255859 A1 | 11/2005 | Krasner |
| 2006/0055595 A1 | 3/2006 | Bustamante et al. |
| 2007/0035344 A1 | 2/2007 | Kobayashi |
| 2011/0001571 A1 | 1/2011 | Sutardja |
| 2011/0095834 A1 | 4/2011 | Fedan |
| 2011/0187422 A1 | 8/2011 | Hammes et al. |

OTHER PUBLICATIONS

Non-Final Office Action for U.S. Appl. No. 13/025,111, mailed on Mar. 8, 2012, 10 pages.

Notice of Allowance for U.S. Appl. No. 13/025,111, mailed on Oct. 4, 2012, 5 pages.

International Preliminary Report on Patentability for PCT Application No. PCT/US2011/024406, mailed on Aug. 23, 2012, 9 pages.

* cited by examiner

TCXO REPLACEMENT FOR GPS

CROSS-REFERENCES TO RELATED APPLICATIONS

The present application claims benefit under 35 USC 119 (e) of U.S. Provisional Application No. 61/303,075, filed Feb. 10, 2010, and U.S. Provisional Application No. 61/422,329, filed Dec. 13, 2010, the contents of both of which applications are incorporated herein by reference in their entirety.

BACKGROUND OF THE INVENTION

The present invention relates to a clock reference signal used in a global positioning system (GPS), and more particularly to a method and apparatus for calibrating a crystal oscillator.

The GPS is a satellite-based navigation system which requires a very stable local timing reference to ensure accurate navigation. There are currently three GPS systems, namely the NAVSTAR Global Positioning System controlled by the United States Defense Department, the GLONASS system maintained by the Russian Republic, and the GALILEO system proposed by Europe.

To decode these satellite signals, a GPS receiver must first acquire the signals transmitted by a minimum number of satellites. A GPS receiver required a very accurate internal frequency reference in order to lock on to the GPS signals.

In general, a GPS receiver has an internal crystal oscillator that is free running when the receiver is first turned on. Acquisition will not be successful if the difference between the PLL frequency of the GPS receiver and the GPS frequency is larger than the carrier frequency offset search range in acquisition.

Conventional GPS receivers typically use a temperature compensated crystal oscillator to provide a stable and accurate internal reference frequency. Such temperature compensated crystals are very stable with time and temperature and provide the GPS receiver with a short amount of time to acquire satellite signals. Conventional temperature compensated crystal oscillators have a frequency drift of ±1 PPM or "ppm" (parts per million) or less throughout the operating temperature range of the crystal.

However, temperature compensated crystals are very expensive. In addition, the initial acquisition time of the satellite signals may be long. A need continues to exist for a low-cost crystal oscillator for GPS receivers. The present invention provides a technical solution to overcome the frequency shift of the uncompensated crystal oscillators and simultaneously enable a fast acquisition time.

BRIEF SUMMARY OF THE INVENTION

A method for determining the frequency drift of a crystal oscillator in response to a change in the temperature of the crystal oscillator, includes, in part, measuring the temperature of the crystal oscillator, and using the data stored in a memory to determine the size of the frequency drift of the crystal oscillator. The data includes a multitude of drift values of the frequency of the crystal oscillator each of which corresponds to a temperature value.

In one embodiment the crystal oscillator is disposed in a GPS receiver. In one embodiment the multitude of drift values of the frequency of the crystal oscillator and the corresponding multitude of temperature values are collected during a tracking phase of the GPS receiver. In one embodiment the crystal oscillator provides a reference clock to a phase-locked loop disposed in the GPS receiver. In one embodiment the phase-locked loop is a fractional phase-locked loop.

In one embodiment, the method further includes, in part, applying a non-linear function to the stored data to determine the frequency drift of the crystal oscillator in response to a temperature change. In one embodiment, the method further includes, changing the center frequency offset of the clock signal applied to the PLL during an acquisition phase of the GPS receiver incrementally and in accordance with a correction factor to generate a multitude of frequency ranges one of which causes the GPS receiver to acquire a GPS satellite signal. In one embodiment, adjacent frequency ranges partially overlap one another.

In one embodiment, the method further includes changing at least one of the drift values of the frequency of the crystal oscillator and its corresponding temperature during a second tracking phase. In one embodiment, the method further includes increasing the number of drift values of the frequency of the crystal oscillator and the number corresponding temperature values during a second tracking phase.

A device in accordance with one embodiment of the present invention includes, in part, a crystal oscillator; a temperature sensor adapted to sense the temperature of the crystal oscillator, a memory adapted to store a multitude of drift values of the frequency of the crystal oscillator and a multitude of corresponding temperature values, and a processor adapted to receive a temperature sensed by the temperature sensor and use the multitude of drift values of the frequency of the crystal oscillator and the multitude of corresponding temperature values to determine the frequency drift of the crystal oscillator caused by the oscillator's temperature.

In one embodiment, the device is a GPS receiver. In one embodiment, the multitude of drift values of the frequency of the crystal oscillator and the corresponding multitude of values of the temperature are collected during a tracking phase of the GPS receiver. In one embodiment, the GPS receiver includes a phase-locked loop that receives a reference clock signal generated by the crystal oscillator. In one embodiment, the phase-locked loop is a fractional phase-locked loop.

In one embodiment, the processor is adapted to apply a non-linear function to the data stored in the memory to determine the frequency drift of the crystal oscillator at any given temperature. In one embodiment, the processor is further adapted to change the center frequency offset of the reference clock signal, applied to the PLL during an acquisition phase of the GPS receiver, incrementally and in accordance with a correction factor to generate a multitude of frequency ranges one of which ranges enables the GPS receiver to acquire the GPS satellite signal. In one embodiment, adjacent frequency ranges partially overlap one another.

In one embodiment, the processor is further adapted to change at least one of the drift values of the frequency of the crystal oscillator and its corresponding temperature value stored in the memory during a tracking phase. In one embodiment, the processor is further adapted to increase the number of drift values of the frequency of the crystal oscillator and the number of corresponding temperature values during a tracking phase.

Embodiment of the present invention provide methods for temperature compensation of an uncompensated crystal oscillator. The method includes starting an acquisition phase upon the initialization of the crystal oscillator and entering a tracking phase once the acquisition phase is completed. The acquisition phase includes measuring the initial temperature of the crystal oscillator, and setting an initial frequency of the phase locked loop in association with the initial temperature. If the difference between the current temperature and the temperature measured before going to sleep is high, acquisition search range of carrier frequency offset will be widened. The method further includes measuring the current temperature of the crystal oscillator periodically after waiting for a time period and comparing the periodically measured temperature with the initial temperature. If the difference between the two temperatures is greater than a threshold value, the acquisition process will be reset.

In another embodiment, the acquisition phase is completed if the correlation between the received GPS signal and the stored PRN code corresponding to a satellite is high; and the receiver enters then the tracking phase.

In an embodiment, the tracking phase includes recording an estimated ppm of the crystal in association with the currently measured temperature and constructing a set of ppm values as a function of the currently measured temperatures.

Embodiments of the present invention also include a device for frequency acquisition having a PLL coupled with a crystal oscillator. The device further includes a temperature sensor for measuring a temperature at the proximity of the crystal oscillator. Additionally, the device includes a controller that can characterize the stability of the crystal frequency relative to the temperature taken at the proximity of the crystal oscillator.

DETAILED DESCRIPTION OF THE INVENTION

Figure 1:
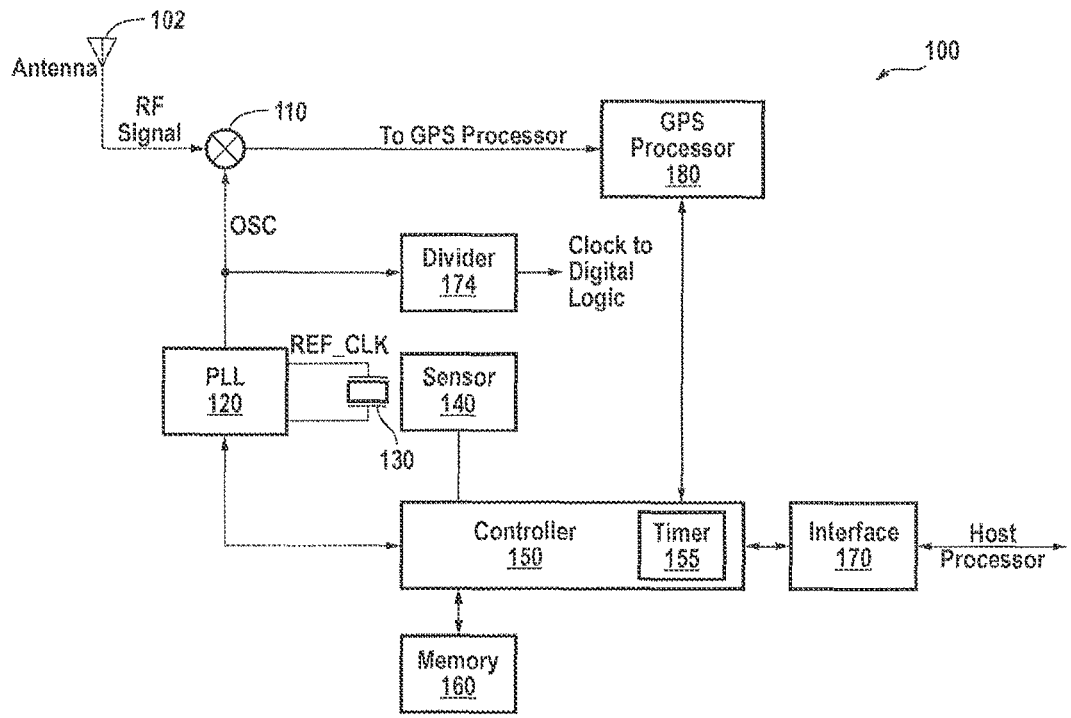
FIG. 1 is a simplified block diagram of a GPS receiver, in accordance with one embodiment of the present invention.

FIG. 1 is a simplified block diagram of a GPS receiver 100, in accordance with one embodiment of the present invention. Receiver 100 is shown as including an antenna 102 that receives the GPS signal and delivers it to mixer 110. Mixer 110 is adapted to downconvert the frequency of the received GPS signal using the clock signal OSC supplied by phase-locked loop (PLL) 120. The output signal of mixer 110 is supplied to GPS processor 180 for further processing. The reference clock signal F_crystal is supplied to PLL 120 by crystal oscillator 130. The oscillating frequency of signal F_crystal may vary in different embodiments. In one example, crystal oscillator 130 may have a nominal frequency of 16.368327 MHz. Crystal oscillator 130 is not compensated over its operating temperature range. GPS receiver 100 is shown as including a temperature sensor 140 positioned in proximity of crystal oscillator 130 and adapted to sense the temperature of crystal oscillator 130 and supply the sensed temperature to controller 150. Controller 150 has access to data stored in memory 160 that characterizes the frequency drift of crystal oscillator 130 as a function of temperature. Controller 150 may communicate with an external host processor (not shown) through interface 170. Controller 150 may contain multiple configuration and control registers (not shown) for configuring and controlling PLL 120 and other blocks of GPS receiver 100. Controller 150 may also include a timer 155 for keeping track of the time period during which GPS processor 180 is in an acquisition mode.

Figure 2:
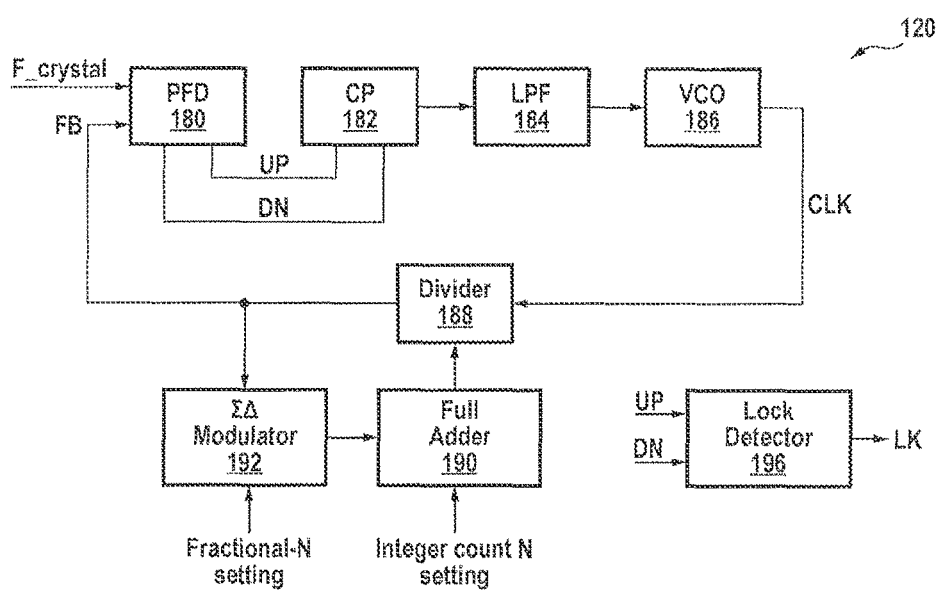
FIG. 2 is a simplified block diagram of a fractional-N phase-locked loop used in the receiver of FIG. 1, in accordance with one embodiment of the present invention.

FIG. 2 is a simplified block diagram of one embodiment of fractional-N phase locked loop 120 of FIG. 1. Phase locked loop 120 maintains a fixed relationship between the phase and frequency of the signal it receives, namely signal F_crystal, and those of the signal it generates, namely signal FB. PLL 120 is shown as including, in part, a phase/frequency detector 180, a charge pump 182, a loop filter 184, and a voltage controlled oscillator (VCO) 186 which generates the clock signal CLK at its output terminal. Divider 188 divides the frequency of signal CLK to generate signal FB.

Fractional-N PLL 120 enables the use of a reference frequency higher than the frequency step size required from the PLL. Phase/frequency detector 180 receives signals REF and Clk, and in response, generates signals UP and DN that correspond to the difference between the phases of the signals F-crystal and FB. Charge pump 182 receives signals UP and DN and in response varies the current $I_1$ which it supplies to loop filter 184. Loop filter 184 stores the charge supplied by current $I_1$ as voltage $V_1$ and then delivers voltage $V_1$ to VCO 186.

If signal F_crystal leads signal CLK in phase-indicating that the VCO is running relatively slowly—the duration of pulse signal UP increases while the duration of pulse signal DN decreases, thereby causing charge pump 182 to increase its net output current $I_1$ until VCO 186 achieves an oscillation frequency at which signal FB is frequency-locked and phase-locked with signal F_crystal. If, on the other hand, signal F_crystal lags signal FB in phase-indicating that the VCO is running relatively fast—the duration of pulse signal UP decreases while the duration of pulse signal DN increases-thereby causing VCO 186 achieve an oscillation frequency at which signal FB is frequency-locked and phase-locked with signal F_crystal. Signal FB is considered to be locked to signal F_crystal if its frequency is within a predetermined frequency range of signal F_crystal. Signal FB is considered to be out-of-lock with signal F_crystal if its frequency is outside the predetermined frequency range of signal F_crystal. The frequency of signal Clk may be substantially equal to the frequency of the received GPS signal or may be a multiple thereof.

Divider 188 may include a dual-mode divide-by-N and divide-by-(N+1) integer divider. Divider 188 is adapted to perform a fractional division operation so as to enable VCO 186 to have any frequency resolution. The frequency of the output signal Clk of VCO 186 may be determined by the following expression:

$$F(Clk)=F\_crystal*(N+F/K)$$

where N, F, and K are integers, with N representing the integer part, and F and K representing the fractional part of the division.

By dividing (K−F) cycles by N and F cycles by (N+1), the resulting frequency is then (K−F)*N+F*(N+1) within K cycles, thus a fractional (F/K) frequency value can be obtained. In one embodiment, the frequency of crystal signal F_crystal is 16.368 MHz, and K is 22 bits. Accordingly, in such embodiments, the fractional-N PLL 120 may produce a frequency resolution of about 4 Hz. In another embodiment, the frequency of crystal signal is 26 MHz.

The fractional-N PLL includes a full adder 190 that receives the integer count N and a sigma-delta modulator 192 that is coupled to full adder 190. The sigma-delta modulator 192 generates a fine (fractional) value for the PLL.

The fractional-N PLL 120, in accordance with the present invention, further provides the advantage of low frequency jitter. As the dual-modulus divider 188 changes state from a divide-by-N to a divide-by-(N+1), a jump in the phase difference at the output of PFD 180 can be caused. This phase jump is periodic and appears as discrete frequency spurs. Sigma-delta modulator 192 is adapted to randomize this periodicity to inhibit the formation of the discrete spurs.

The PLL 120 is further shown as including a lock detector 196 that receives signals Up and DN from PFD 180 to assert the lock signal LK when the PLL is in lock. In one embodiment, lock detector 196 asserts the lock signal CLK when the signals UP and DOWN have the same logic state.

Figure 3A:
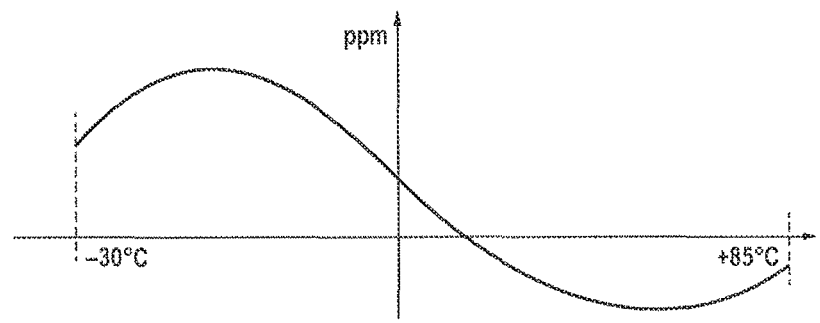
FIG. 3A is a plot representing a typical frequency change of a commercial crystal oscillator as the ambient temperature changes.
Figure 3B:
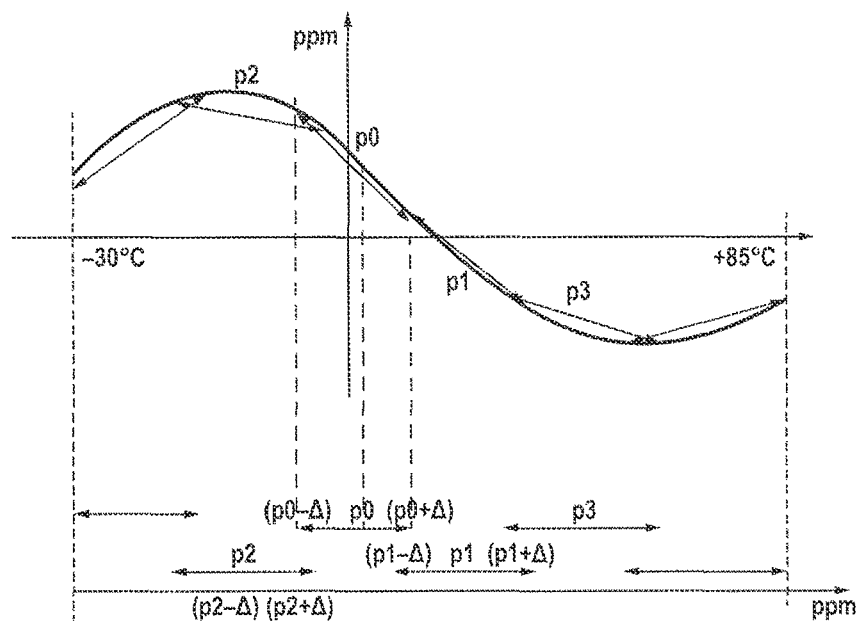
FIG. 3B shows the plot of FIG. 3A partitioned into a number of frequency regions used to acquire a GPS signal, in accordance with one embodiment of the present invention.

FIG. 3A is a plot representing a typical frequency change ($\Delta f/f$) of a commercial crystal oscillator as the ambient temperature changes. FIG. 3B shows the plot of FIG. 3A partitioned into multiple overlapping regions. These regions are used during the acquisition phase, in accordance with one embodiment of the present invention and as described below. Within each part per million (ppm) region, the frequency change is considered to be lying within the acquisition carrier offset search range of GPS processor 180. In such embodiments, the frequency measurement data at some temperature points can be obtained and stored in a memory of GPS processor 180 when it is in tracking mode. A filtering algorithm can be utilized to reduce measurement noise. The number of data points can be chosen by considering the trade-off between the memory size and the complexity of frequency estimation.

During an acquisition phase, the frequency estimation at any given temperature can be obtained (i) directly from stored data; (ii) by linear interpolation/extrapolation of stored data using an algorithm, such as the least square algorithm, and/or (iii) by utilizing odd or even symmetry of frequency curve of the crystal oscillator about the temperature $T_0$ given ppm vs. temperature is a third order polynomial as in FIG. 3C.

For example, the frequency measurement can be stored for every 2 degree. If the operating temperature range is between $-30°$ C. and $85°$ C., 61 frequency measurement data (at $-35°$ C., $-33°$ C., $-26°$ C., ..., $90°$ C.) are stored in the memory (e.g., a non-volatile memory such as flash). Frequency data storage at temperature T1 can be initialized (i.e. stored the first time) with frequency measurement from the GPS device if the measured temperature is between T1$-1°$ C. and T1$+1°$ C. Stored frequency data at temperature T2 can be updated with frequency measurement from the GPS device using an IIR (infinite impulse response) filter if the measured temperature is between T2$-0.5°$ C. and T2$+0.5°$ C.

Stored frequency data are used for frequency estimation during acquisition phase. A linear extrapolation scheme may be used to estimate the frequency for temperatures for which no data is stored. For example, assume that the frequency data at temperature T3, for which no measured data is available, is required. Accordingly, frequency estimation can be performed by using linear interpolation if frequency measurement data are stored for any two temperatures T4 and T5 which satisfies T4<T3<T5. A simple linear interpolation can be computed as:

$$ppm\_out = (y2-y1)*(measured\ temperature - x1)/(x2-x1) + y1;$$

where y1=ppm_stored1, y2=ppm_stored2, x1=temperature corresponding to ppm_stored1, and x2=temperature corresponding to ppm_stored2.

Figure 4:
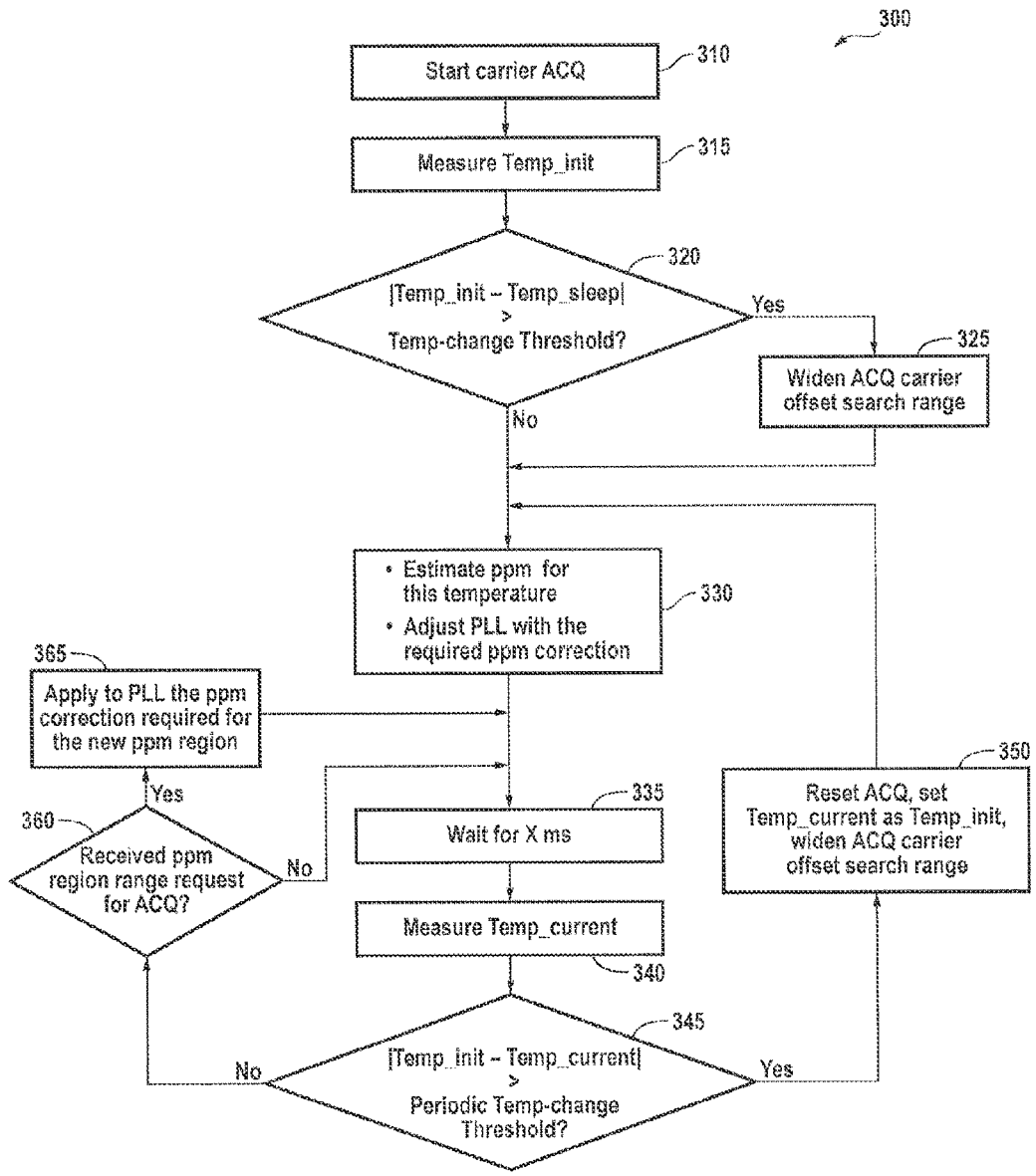
FIG. 4 is a flowchart of steps used to acquire a GPS signal, in accordance with one embodiment of the present invention.

If all the temperatures for which stored data exist are either larger or smaller than the desired temperature T3, a linear extrapolation may be used. Alternatively, more data points can be obtained by making use of the fact that a frequency change vs. the temperature curve is typically odd-symmetrical about room temperature or even-symmetrical about room temperature. As is well known, there are different kinds of quartz plates determined by different cut angles to quartz bars such as AT, BT, CT, DT, SL, and the like. Different types of quartz cuts show different available elastic, piezoelectric, and dielectric properties. For the most popular AT-cut crystals, the frequency change vs. the temperature curve is substantially odd-symmetrical. For CT, BT, NT, XY, DT, SL cut crystals, the frequency change vs. the temperature curve is substantially even-symmetrical. FIG. 4 shows the ppm change in frequency as a function of temperature for a number of cut crystals.

An example of linear extrapolation with a least square algorithm can be expressed as for 3 data points (N=3):

$$A = x1 + x2 + x3;$$

$$B = x1^2 + x2^2 + x3^2;$$

$$C = x1 \times y1 + x2 \times y2 + x3 \times y3;$$

$$D = y1 + y2 + y3;$$

for 4 data points (N=4):

$$A = x1 + x2 + x3 + x4;$$

$$B = x1^2 + x2^2 + x3^2 + x4^2;$$

$$C = x1 \times y1 + x2 \times y2 + x3 \times y3 + x4 \times y4;$$

$$D = y1 + y2 + y3 + y4;$$

for 5 data points (N=5):

$$A = x1 + x2 + x3 + x4 + x5;$$

$$B = x1^2 + x2^2 + x3^2 + x4^2 + x5^2;$$

$$C = x1 \times y1 + x2 \times y2 + x3 \times y3 + x4 \times y4 + x5 \times y5;$$

$$D = y1 + y2 + y3 + y4 + y5;$$

$$a = (N \times C - A \times D)/(B \times N - A^2)$$

$$b = (B \times D - A \times C)/(B \times N - A^2)$$

where (xi, yi) are data points for linear curve fitting, N is number of data points, and a and b are resulting coefficients from least square algorithm (yi=[a]×[xi]+b), where x represents the multiplication operation and i is an integer index.

Figure 3C:
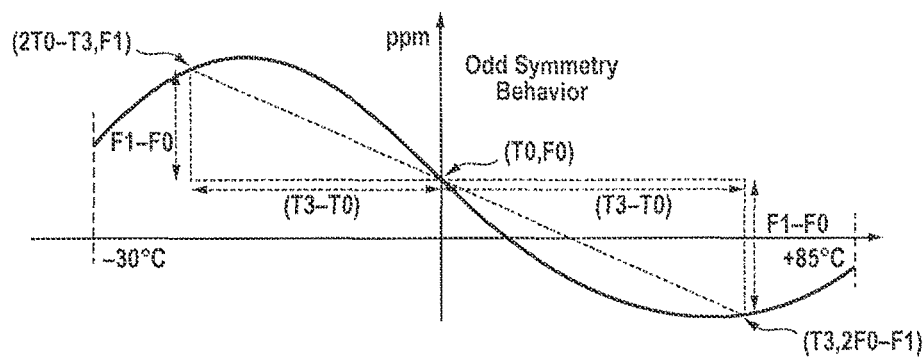
FIG. 3C shows the symmetry of the plot shown in FIG. 3A.

If valid ppm data exists for temperatures that are smaller and larger than a desired temperature, then linear interpolation can then be applied to estimate the frequency at the desired temperature. Using odd or even symmetry and then applying linear interpolation improves estimation accuracy compared to linear extrapolation. If a frequency curve has odd symmetry with respect to (T0, F0), and (T0+[T0−T3], F1) can be obtained from stored data or linear interpolation, then the frequency at T3 can be estimated with the equation F0+[F0−F1] as shown in FIG. 3C. In another embodiment, a polynomial function can be designed to best fit the frequency change curve.

FIG. 3C is a graph showing the odd symmetry of frequency change in ppm vs. temperature for estimating the ppm value associated with a temperature range. The frequency change in ppm vs. temperature range is substantially odd-symmetric with respect to an inflection point (T0, F0). Typically, T0 is around the room temperature of 25° C.

In accordance with one embodiment of the present invention, the ppm range of the crystal oscillator's frequency is partitioned into multiple regions, as shown in FIG. 3B. Upon initialization of the crystal oscillator, the initial temperature of the crystal oscillator is measured and receiver 100 applies a correction to the PLL based on a first region that is associated with the measured initial temperature. For correction, frequency ppm vs. temperature curve which is formed during a tracking phase is utilized. While the PLL is in the acquisition phase, the current temperature of the crystal oscillator is periodically measured and compared with the initial temperature. If the difference between the currently measured temperature and the initial temperature obtained at the beginning of the acquisition exceeds a threshold value, GPS processor 180 (or controller 150) resets the acquisition, sets the current temperature as the initial temperature and widens the acquisition carrier offset search range (if the carrier offset search range has not reached the maximum allowed search range), so as to cause the crystal temperature to be measured again after a certain time period. This process continues until the acquisition phase is successful. In one embodiment, the acquisition phase is terminated when the PLL operates within an acceptable frequency range of the received GPS signal frequency. In another embodiment, the acquisition phase is terminated after the elapse of a certain time period corresponding to a timeout.

Upon completion of a successful acquisition, GPS receiver 100 enters a tracking phase during which the frequency change ppm vs. temperature will be updated and maintained. The maintenance of the frequency change in ppm vs. temperature can be performed using a look-up table, a polynomial curve, or multiple affine functions. The tracking phase is validated by making sure that tracking loops are in lock and there is a valid pseudo range/position/velocity/time fix. In one embodiment, the tracking phase is validated when the GPS receiver 100 obtains a suitable correlation between the received GPS signal and a spreading code corresponding to a satellite. After the tracking operation is validated, the difference between a nominal frequency of crystal and its true frequency value in association with the measured temperature is stored. The stored data is used to compensate for the frequency drift of the crystal oscillator over temperature.

FIG. 4 is a flowchart 300 of actions taken to acquire a GPS signal in accordance with one embodiment of the present invention. Prior to this acquisition, the ppm change in the frequency of the oscillator as a function of temperature is obtained during a tracking and stored in the receiver's memory. After starting the carrier acquisition phase 310, the initial temperature, shown by parameter temp_init, of the crystal oscillator is measured 315. The initial temperature temp_init is compared 320 with the temperature of the crystal oscillator recorded before the receiver in which the oscillator is disposed enters the sleep mode; this temperature is shown as temp_sleep. If the difference (temp_init−temp_sleep) is detected 320 as being larger than a threshold value, the acquisition carrier offset search range is increased if the carrier offset search range has not reached a maximum value. Thereafter, a ppm correction corresponding to the initial temperature is estimated 330 and used to adjust the frequency of the PLL used in the receiver. The ppm estimate in frequency is obtained using the frequency-temperature data collected during a tracking phase, as explained above. If the difference (temp_init−temp_sleep) is not detected 320 as being larger than the threshold value, the frequency of the PLL is adjusted 330 in accordance with the ppm estimate of the frequency in accordance with the initial value of the temperature. After the elapse 335 of a certain time period, the current temperature is measured 340 again.

Subsequently the initial temperature at 315 is compared 340 with the current temperature temp_current. If the difference between the current temperature and the initial temperature is detected 345 as being greater than a threshold value, the acquisition process will be reset 350, the value of the initial temperature temp_init is set to the current temperature, and the acquisition carrier offset search range is widened if the carrier offset search range has not reached the maximum allowed value. The process moves to step 330. If the difference between the current temperature and the initial temperature is detected 345 as being less than or equal to the threshold value, then a determination is made 360 about whether a request for the ppm region range has been received. If the ppm region range request has been received 360, the ppm correction required for the new ppm region range is applied 365 to the PLL. If the ppm region range request has not been received 360, the process moves to step 335.

Referring to flowchart 300 and FIG. 3B concurrently, at 335, 340, 345, 360 and 365 of flowchart 300 attempt is made to acquire the GPS signal for a known time period. If the acquisition is unsuccessful, the acquisition carrier offset search range is changed. For example, assume that the acquisition is initially made at the center frequency ppm of P0 with a range defined by (P0−Δ) to (P0+Δ). If the acquisition in this frequency range is successful, tracking operation may begin. If the acquisition in this frequency range is unsuccessful, the center frequency ppm is moved to P1 (P1 is higher than P0) with a ppm frequency range defined by (P1−Δ) to (P1+Δ). If the acquisition in the ppm frequency range (P1−Δ) to (P1+Δ) is successful, tracking operation may begin. If the acquisition in the ppm frequency range (P1−Δ) to (P1+Δ) is unsuccessful, the center frequency ppm is moved to P2 with a ppm frequency range defined by (P2−Δ) to (P2+Δ). If the acquisition in the ppm frequency range (P2−Δ) to (P2+Δ) is successful, tracking operation may begin. If the acquisition in the ppm frequency range (P2−Δ) to (P2+Δ) is unsuccessful, the center frequency ppm is moved to P3 with a ppm frequency range defined by (P3−Δ) to (P3+Δ). In some embodiments (P2−P0) is the same as (P0−P1). In other embodiments, (P2−P0) is different from (P0−P1). This process continues, until the GPS signal is successfully acquired.

In another embodiment, the acquisition phase may be considered as completed when the correlation between the received GPS signal and the stored PRN code corresponding to a satellite is high. Then the acquisition phase is switched to the tracking phase. The tracking phase is considered as validated when the carrier offset tracking and the code phase tracking loops are in lock and a valid pseudo range/position/velocity/time fix is obtained.

Figure 5:
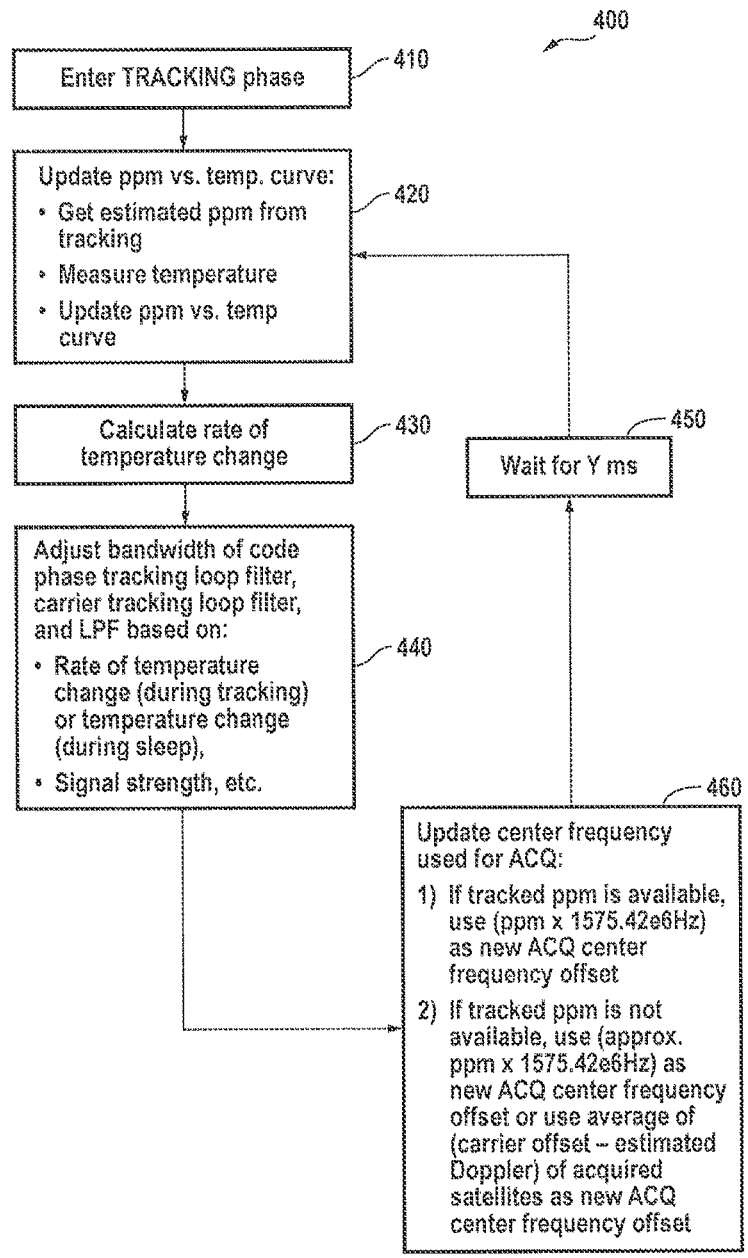
FIG. 5 is a flow chart of steps used during a GPS tracking mode, in accordance with one embodiment of the present invention.
Figure 6:
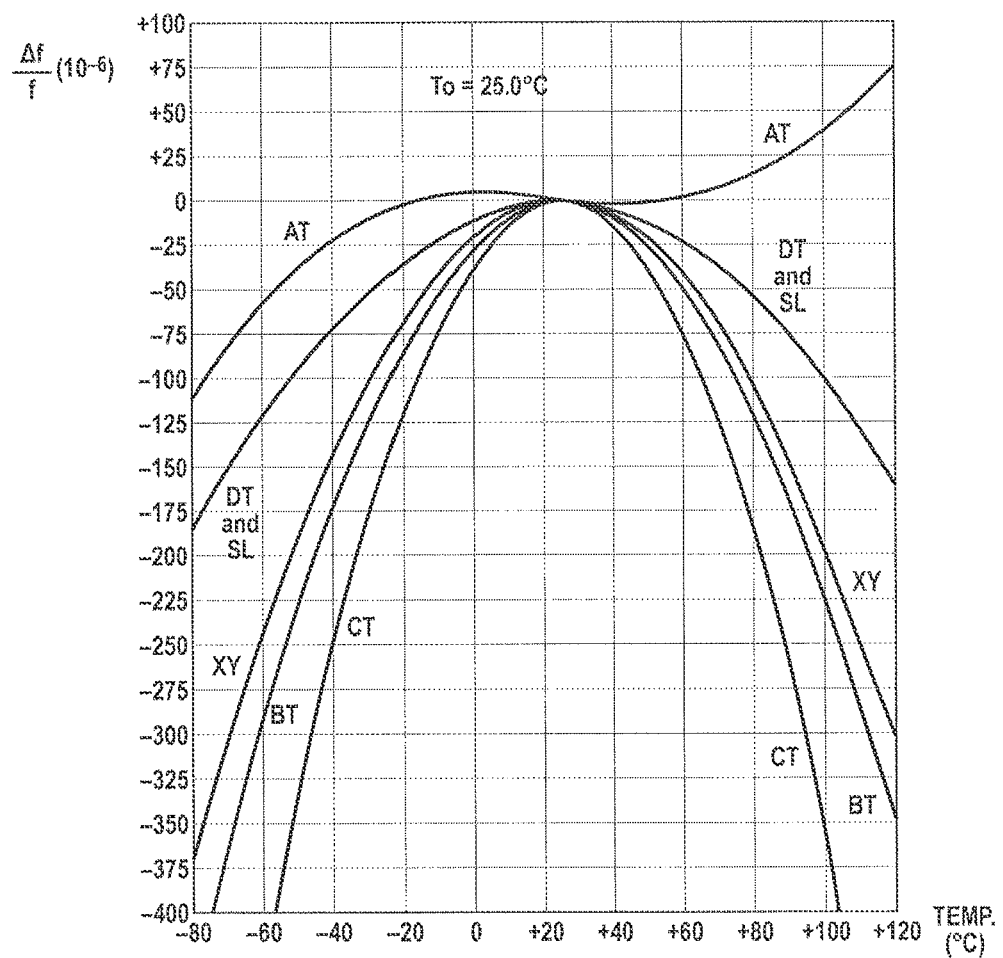
FIG. 6 is a plot of frequency change as a function of temperature for a number of different cuts of commercially available crystal.

FIG. 5 is a flow chart 400 of actions taken during a tracking operation, in accordance with one embodiment of the present invention. Tracking phase starts at 400. During the tracking phase, the ppm frequency change estimate is known and is relatively more accurate. Accordingly, at 420, the ppm frequency changes are estimated and the corresponding temperatures are sensed and recorded. The ppm frequency changes and the temperature corresponding to each ppm frequency change are stored in a table residing in the receiver's local memory for future temperature compensation. The new data added to the memory may be used to generate or update the function that establishes the relationship between the ppm frequency change and temperature. Such a function may be presented as multiple affine functions (e.g., ppm=slope×temperature change+offset), or a polynomial equation. Next, the rate of temperature change is determined at 430. Based on the calculated rate of temperature change during the tracking process or temperature change during the device sleep mode or the signal strength, the bandwidth of the code phase tracking loop filter, the bandwidth of the carrier tracking loop filter, and the bandwidth of the lowpass filter may be adjusted at 440. Next, the center frequency offset during the acquisition phase is updated 460. If at 460, the tracked ppm is available, in one embodiment, the acquisition center frequency offset is set to (ppm×1575.42 MHz). If at 460, the tracked ppm is not available, the acquisition center frequency offset is set either to (approximate ppm×1575.42 MHz) or to the average of (carrier offset frequency—estimated Doppler frequency). The tracking process restarts at 420 after waiting 450 a certain time interval. In another embodiment of the present invention, a curve of the frequency change vs. the associated temperature change can be updated.

While the advantages and embodiments of the present invention have been depicted and described, there are many more possible embodiments, applications and advantages without deviating from the spirit of the inventive ideas described herein. It will be apparent to those skilled in the art that many modifications and variations in construction and widely differing embodiments and applications of the present invention will suggest themselves without departing from the spirit and scope of the invention.

What is claimed is:

1. A device comprising:
   a phase-locked-loop circuit;
   a crystal oscillator coupled to the phase-locked-loop circuit;
   a temperature sensor configured to determine a temperature associated with the crystal oscillator during at least first and second times; and
   a controller configured to:
      calculate a difference between the temperatures determined during the at least first and second times;
      compare the temperature difference with a threshold value; and
      vary an acquisition range of the phase-locked-loop circuit in accordance with the comparison result.

2. The device of claim 1 wherein the phase-locked-loop circuit comprises a sigma-delta modulator.

3. The device of claim 1 wherein the controller comprises a plurality of configuration and control registers for configuring and controlling the phase-locked-loop circuit.

4. The device of claim 1 wherein the controller is configured to operate the phase-locked-loop circuit in an acquisition phase and in a tracking phase.

5. The device of claim 4 wherein the controller is configured to:
   record a frequency offset value of the crystal oscillator in association with a determined current temperature in the tracking phase;
   store the frequency offset value in a memory; and
   construct a set of the frequency offset values as a function of the determined current temperature.

6. The device of claim 1 wherein the controller is operable to store the frequency difference associated with the measured temperature.

7. The device of claim 1 wherein the controller is operable to apply a frequency correction to the phase locked loop based on a measured temperature at an initialization of an acquisition phase.

8. A method of adjusting an acquisition range of a phase-locked loop, the method comprising:
   determining a temperature associated with a crystal oscillator coupled to the phase-locked loop during at least first and second times;
   calculating a difference between the temperatures determined during the at least first and second times;
   comparing the temperature difference with a threshold value; and
   varying the acquisition range of the phase-locked-loop circuit in accordance with the comparison result.

9. The method of claim 8 further comprising:
   recording a frequency offset value of the crystal oscillator in association with a determined current temperature in a tracking phase;
   storing the frequency offset value in a memory; and
   constructing a set of the frequency offset values as a function of the determined current temperature.

10. The method of claim 9 wherein constructing the set of the frequency offset values comprises:
    building a plurality of affine functions, wherein each of the plurality of affine functions fits a subset of the set of the frequency offset values.

11. The method of claim 9 wherein constructing the set of the frequency offset values comprises:
    building a polynomial function to best fit the set of the frequency offset values.

* * * * *